US007223506B1

(12) United States Patent
Kitson et al.

(10) Patent No.: US 7,223,506 B1
(45) **Date of Patent: *May 29, 2007**

(54) IMAGEABLE MEMBERS WITH IMPROVED CHEMICAL RESISTANCE

(75) Inventors: Anthony P. Kitson, Evans, CO (US); Shashikant Saraiya, Fort Collins, CO (US); Kevin B. Ray, Fort Collins, CO (US); James L. Mulligan, Fort Collins, CO (US); Frederic E. Mikell, Greeley, CO (US); Larisa Novoselova, Aurora, CO (US); Eric Clark, Loveland, CO (US)

(73) Assignee: Eastman Kodak Company, Rochester, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/393,156

(22) Filed: Mar. 30, 2006

(51) Int. Cl.
*G03F 7/038* (2006.01)
*G03F 7/039* (2006.01)
*G03F 7/14* (2006.01)

(52) U.S. Cl. .................. 430/15; 430/270.1; 430/271.1; 430/302; 430/326; 430/905; 430/910; 430/964

(58) Field of Classification Search ............. 430/270.1, 430/271.1, 302, 15, 326, 905, 910, 964
See application file for complete search history.

(56) References Cited

U.S. PATENT DOCUMENTS 5,731,127 A 3/1998 Ishizuka et al.
6,143,464 A 11/2000 Kawauchi
6,352,811 B1 3/2002 Patel et al.
6,969,579 B1 11/2005 Kitson et al.
2002/0081522 A1 6/2002 Miyake et al.

FOREIGN PATENT DOCUMENTS

EP 1 522 417 4/2005
JP 2000-330265 11/2000
JP 2003-335756 11/2003
WO WO 2005/018934 3/2005

OTHER PUBLICATIONS

JP abstract 11-119419 (Apr. 30, 1999), Kawachi Ikuo.
U.S. Appl. No. 11/337,778 (D-91856/JLT), filed Jan. 23, 2006, titled *Multilayer Imageable Element Containing Sulfonamido Resin*, by Saraiya et al.

*Primary Examiner*—Richard Schilling
(74) *Attorney, Agent, or Firm*—J. Lanny Tucker

(57) ABSTRACT

Single-layer and multilayer imageable elements have a substrate and at least one imageable layer and can be used to prepare positive-working lithographic printing plates. The imageable elements also include a radiation absorbing compound and a solvent-resistant polymer binder comprising an —N(R)—C(=X)—N(R')—S(=O)$_2$— moiety that is attached to the polymer backbone, wherein X is O or S, R and R' are independently hydrogen, halo, or an alkyl group having 1 to 6 carbon atoms. This solvent-resistant polymer binder is located in the imageable layer closest to the substrate and provides improved chemical resistance.

19 Claims, No Drawings

IMAGEABLE MEMBERS WITH IMPROVED CHEMICAL RESISTANCE

FIELD OF THE INVENTION

This invention relates to both single- and multilayer positive-working imageable elements having improved chemical resistance due to the presence of a particular solvent-resistant polymer. This invention also relates to methods of imaging to provide positive-working imaged elements such as lithographic printing plates.

BACKGROUND OF THE INVENTION

In conventional or "wet" lithographic printing, ink receptive regions, known as image areas, are generated on a hydrophilic surface. When the surface is moistened with water and ink is applied, the hydrophilic regions retain the water and repel the ink, and the ink receptive regions accept the ink and repel the water. The ink is transferred to the surface of a material upon which the image is to be reproduced. For example, the ink can be first transferred to an intermediate blanket that in turn is used to transfer the ink to the surface of the material upon which the image is to be reproduced.

Recent developments in the field of printing plate precursors concern the use of lasers or laser diodes for imaging. Laser exposure does not require conventional silver halide graphic arts films as intermediate information carriers (or "masks") since the lasers can be controlled directly by computers. High-performance lasers or laser-diodes that are used in commercially-available image-setters generally emit radiation having a wavelength of at least 700 nm, and thus the radiation-sensitive compositions are required to be sensitive in the near-infrared or infrared region of the electromagnetic spectrum. However, other useful radiation-sensitive compositions are designed for imaging with ultraviolet or visible radiation.

Imageable elements useful to prepare lithographic printing plates typically comprise an imageable layer applied over the hydrophilic surface of a substrate. The imageable layer includes one or more radiation-sensitive components that can be dispersed in a suitable binder. Alternatively, the radiation-sensitive component can also be the binder material. Following imaging, either the imaged regions or the non-imaged regions of the imageable layer are removed by a suitable developer, revealing the underlying hydrophilic surface of the substrate. If the imaged regions are removed, the element is considered as positive-working. If the non-imaged regions are removed, the element is considered as negative-working. In each instance, the regions of the imageable layer (that is, the image areas) that remain are ink-receptive, and the regions of the hydrophilic surface revealed by the developing process accept water and aqueous solutions (typically a fountain solution) and repel ink.

Imaging of the imageable element with ultraviolet and/or visible radiation is typically carried out through a mask that has clear and opaque regions. Imaging takes place in the regions under the clear regions of the mask but does not occur in the regions under the opaque mask regions. Use of a mask is time-consuming and has a number of significant disadvantages.

Direct digital imaging has obviated the need for imaging through a mask and is becoming increasingly important in the printing industry. Imageable elements for the preparation of lithographic printing plates have been developed for use with infrared lasers. Thermally imageable, multi-layer elements are described, for example, U.S. Pat. No. 6,294,311 (Shimazu et al.), U.S. Pat. No. 6,352,812 (Shimazu et al.), U.S. Pat. No. 6,593,055 (Shimazu et al.), U.S. Pat. No. 6,352,811 (Patel et al.), U.S. Pat. No. 6,358,669 (Savariar-Hauck et al.), and U.S. Pat. No. 6,528,228 (Savariar-Hauck et al.), U.S. Patent Application Publication 2004/0067432 A1 (Kitson et al.).

Radiation-sensitive compositions and imageable elements have also been designed for imagewise exposure and/or development while on a printing press using fountain solutions and/or printing inks, as described for example in U.S. Pat. No. 6,582,882 (Pappas et al.) and U.S. Pat. No. 6,899,994 (Huang et al.), U.S. Patent Application Publication 2004/0260050 (Munnelly et al.), and WO 2004/101280 (Munnelly et al.). These imageable elements typically comprise a single imageable layer on the substrate.

U.S. Pat. No. 6,143,464 (Kawauchi) describes positive-working photosensitive compositions containing a blend of phenolic resins and a copolymer derived from acrylic monomers with pendant sulfonamide groups. These compositions are used to prepare single-layer imageable elements.

Multilayer imageable elements containing sulfonamide polymers are described in U.S. Pat. No. 6,352,811 (Patel et al.) and U.S. Patent Application Publication 2002/0081522 (Miyake et al.).

Copending and commonly assigned U.S. Ser. No. 11/337,778 (filed Jan. 23, 2006 by Saraiya, Kitson, Mikell, and Novoselova) describes multi-layer positive-working elements containing a resin with pendant sulfonamide groups in outer ink-receptive layers to reduce the formation of sludge in seasoned developer solutions.

PROBLEM TO BE SOLVED

In use, lithographic printing plates (both negative- and positive-working) come into contact with developer solutions, fountain solutions, and inks. In addition, the elements may be subjected to blanket washes to remove inks and various cleaning solutions for blanket and press rollers. While the lithographic printing literature describes various imageable elements with advantageous properties, there is a continuing need to improve on the various properties of such elements and especially to provide increased resistance to various chemicals and solvents used in development and printing.

SUMMARY OF THE INVENTION

The present invention provides an imageable element comprising a substrate having thereon one or more layers, the element further comprising a radiation absorbing compound and a solvent-resistant polymer binder that is in the layer that is nearest the substrate, the solvent-resistant polymer binder comprising a polymer backbone and an —N(R)—C(=X)—N(R')—S(=O)$_2$— moiety that is attached to the polymer backbone, wherein X is O or S, and R and R' are independently hydrogen, halo, or an alkyl group having 1 to 6 carbon atoms.

In some embodiments of this invention, the imageable element comprises both inner layer and ink-receptive outer layer, the solvent-resistant polymer binder described above is present in the inner layer, and the ink receptive outer layer is free of polymers comprising the —N(R)—C(=X)—N(R')—S(=O)$_2$— moiety.

In other embodiments, the imageable element has a single imageable layer comprising the solvent-resistant polymer binder described above and a radiation absorbing compound.

This invention also provides a method for forming an image comprising:

A) thermally imaging the single- or multilayer imageable element of this invention, thereby forming an imaged element with imaged and non-imaged regions, B) contacting the imaged element with an alkaline developer to remove only the imaged regions, and C) optionally, baking the imaged and developed element.

The single- and multilayer imageable elements of this invention have improved resistance to various chemicals and solvents used in lithographic imaging and printing because of the presence of the solvent-resistant polymer binder described herein having the noted —N(R)—C(═X)—N(R')—S(═O)$_2$— moiety.

DETAILED DESCRIPTION OF THE INVENTION

Definitions

Unless the context indicates otherwise, when used herein, the terms "imageable element" and "printing plate precursor" are meant to be references to embodiments of the present invention.

By "single-layer" imageable element, we mean an imageable element of this invention that has only a single layer needed for providing a positive image. The "solvent-resistant polymer binder" (defined below) would be located in this single imaging layer that is usually the outermost layer. However, such elements may comprise additional non-imaging layers [such as subbing layers or an overcoat comprising an oxygen-impermeable, water-soluble polymer such as a poly(vinyl alcohol)] on either side of the substrate.

By "multilayer" imageable element, we mean an imageable element of this invention that has at least two layers required for providing an image, for example, "inner" and "outer" layers as described below. The "solvent-resistant polymer binder" (defined below) is located in the inner layer. However, such elements may comprise additional non-imaging layers on either side of the substrate, including but not limited to overcoat, subbing, and adhesion layers.

The term "solvent-resistant polymer binder" refers to the polymers defined herein that comprise the —N(R)—C(═X)—N(R')—S(═O)$_2$— moiety defined herein. These solvent-resistant polymer binders are described in more detail below and are useful in both the single-layer and multilayer imageable elements of this invention.

In addition, unless the context indicates otherwise, the various components described herein such as "solvent-resistant polymer binder", "polymeric materials", "phenolic resin binder", "dissolution inhibitor", "added copolymer", "coating solvent", "radiation absorbing compound", "alkaline developer", and similar terms also refer to mixtures of such components. Thus, the use of the article "a" or "an" is not necessarily meant to refer to only a single component.

Unless otherwise indicated, percentages refer to percents by dry weight.

For clarification of definitions for any terms relating to polymers, reference should be made to "Glossary of Basic Terms in Polymer Science" as published by the International Union of Pure and Applied Chemistry ("IUPAC"), *Pure Appl. Chem.* 68, 2287–2311(1996). However, any definitions explicitly set forth herein should be regarded as controlling.

Unless otherwise indicated, the term "polymer" refers to high and low molecular weight polymers including oligomers and includes homopolymers and copolymers.

The term "copolymer" refers to polymers that are derived from two or more different monomers. That is, they comprise recurring units having at least two different chemical structures.

The term "backbone" refers to the chain of atoms in a polymer to which pendant groups can be attached. An example of such a backbone is an "all carbon" backbone obtained from the polymerization of one or more ethylenically unsaturated polymerizable monomers. However, other backbones can include heteroatoms wherein the polymer is formed by a condensation reaction or some other means.

Uses

The imageable elements can be used to provide imaged elements for various purposes. The preferred use is as lithographic printing plate precursors as described in more detail below. However, this is not meant to be the only use of the present invention. For example, the imageable elements can also be used as thermal patterning systems and to form masking elements and printed circuit boards.

Solvent-Resistant Polymer Binders

The solvent-resistant polymer binders that provide the advantages of this invention generally have a polymer backbone and an —N(R)—C(═X)—N(R')—S(═O)$_2$— moiety that is attached to the polymer backbone wherein X is O or S (preferably O).

R and R' are independently hydrogen, halo (such as fluoro, chloro, or bromo groups), or a substituted or unsubstituted alkyl group having 1 to 6 carbon atoms (such as methyl, ethyl, iso-propyl, n-butyl, t-butyl, n-hexyl, methoxymethyl, and benzyl groups). Preferably, R and R' are independently hydrogen or a substituted or unsubstituted methyl or ethyl group. More preferably, each of R and R' is hydrogen or unsubstituted methyl group.

Generally, the solvent-resistant polymer binder is an acrylic resin comprising recurring units derived from one or more ethylenically unsaturated polymerizable monomers, at least one of which monomers comprises the noted —N(R)—C(═X)—N(R')—S(═O)$_2$— moiety. More particularly, the solvent-resistant polymer binder can be represented by the following Structure (I):

(I)

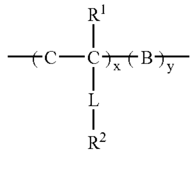

wherein $R^1$ is hydrogen, a substituted or unsubstituted alkyl group having 1 to 6 carbon atoms (as defined above for R and R'), or a halo group (as defined above for R and R'). Preferably, $R^1$ is hydrogen, an unsubstituted methyl group, or a chloro group.

$R^2$ represents the —N(R)—C(═X)—N(R')—S(═O)$^2$—$R^3$ group wherein $R^3$ is a substituted or unsubstituted aliphatic group or a substituted or unsubstituted aryl group attached to —S(═O)$_2$— through a carbon atom. Preferably, $R^3$ is a substituted or unsubstituted alkyl group having 1 to 12 carbon atoms (such as methyl, methoxy, ethyl, iso-propyl, t-butyl, n-dodecyl, benzyl, and hydroxymethyl groups), substituted or unsubstituted cycloalkylene group having 5 to 10 carbon atoms in the ring (such as cyclopenyl, cyclohexyl, 4-methylcyclohexyl, and 3-phenylcyclohexyl groups), substituted or unsubstituted aryl group having 6 to 10 carbon atoms in the ring (such as phenyl, naphthyl, 3-methylphenyl, 4-chlorophenyl, and 4-carboxyphenyl groups), or a substituted or unsubstituted heterocyclyl group having 5 to 10 carbon, oxygen, nitrogen, or sulfur atoms in the ring (such as pyridinyl, pyridyl, and furanyl groups), or any combinations thereof that are directly linked together, or linked together with one or more oxy, carbonyl, amido, or thio groups.

X is O or S, but preferably, X is O.

L is a direct bond or a linking group, including but not limited to, a substituted or unsubstituted alkylene group having 1 to 6 carbon atoms in the chain (such as methylene and ethylene groups), substituted or unsubstituted arylene groups having 6- or 10-membered arylene group in the chain, a —C(O)O-alkylene, —C(O)O-alkylene-phenylene-, or —C(O)O-phenylene group wherein the alkylene moiety has 1 to 4 carbon atoms (including branched groups), and the alkylene and phenylene moieties can be further substituted with one or more alkoxy, aryl, or other substituent groups. In addition, L can be a combination of two or more of the noted linking groups such as, for example, a substituted arylenealkylene group, such as a phenylenealkylene group (for example, a -phenylene-$C(CH_3)_2$— group), or a substituted alkylenearylene group.

In Structure (I), x is from about 20 to 85 weight % (preferably from about 25 to about 75 weight %), and y is from 15 to about 80 weight % (preferably from about 25 to about 75 weight %).

B represents recurring units derived from one or more ethylenically unsaturated polymerizable monomers that do not contain an $R^2$ group such as recurring units derived from a (meth)acrylate, (meth)acrylamide [such as benzoic acid (meth)acrylamide, hydroxyphenyl (meth)acrylamide, and sulfamoylphenyl (meth)acrylamide], vinyl ether, vinyl ester, vinyl ketone, olefin, unsaturated imide, unsaturated anhydride, N-vinyl pyrrolidone, N-vinyl carbazole, 4-vinyl pyridine, (meth)acrylonitrile, or styrenic monomer. Preferably, B represents recurring units derived from one or more (meth)acrylates, styrenic monomers, (meth)acrylonitriles, N-substituted maleimides, or (meth)acrylamides as defined above.

More preferably, the recurring units represented by B are derived from styrene, N-phenylmaleimide, (meth)acrylonitrile, or (meth)acrylamide, or mixtures of two or more of these monomers. In some embodiments, the copolymers comprise B recurring units derived from 1 to 30 weight % of methyl methacrylate and 1 to 30 weight % of one or more of benzoic acid (meth)acrylamide, hydroxyphenyl (meth) acrylamide, and sulfamoylphenyl (meth)acrylamide.

For example, in some preferred embodiments, x is from about 30 to about 70 weight %, y is from about 30 to about 70 weight %, and B represents recurring units derived from about 1 to about 30 weight % of (meth)acrylamide, from about 25 to about 50 weight % of (meth)acrylonitrile, from about 1 to about 30 weight % of N-phenylmaleimide, and optionally from about 1 to about 30 weight % of methyl methacrylate or from about 1 to about 30 weight % of one or more of benzoic acid (meth)acrylamide, hydroxyphenyl (meth)acrylamide, and sulfamoylphenyl (meth)acrylamide (or any combinations of these optional monomers).

Most preferably, x is from about 30 to 70 weight %, y is from about 30 to about 70 weight %, and the recurring units comprising the $R^2$ group are derived from one or more of the following ethylenically unsaturated polymerizable monomers A-1 through A-6:

(A-1)

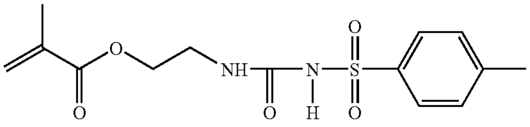
, (A-2)

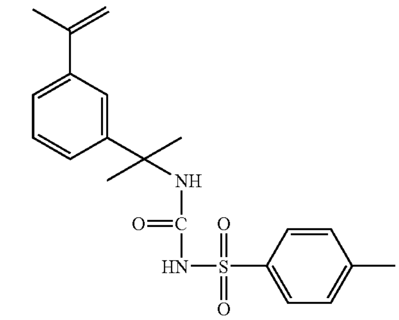

(A-3)

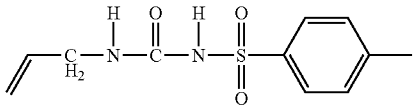

(A-4)

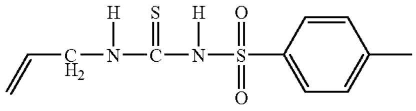

(A-5)

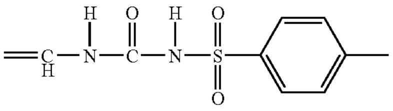

(A-6)

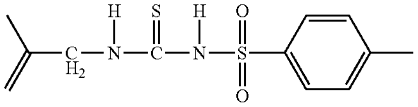
.

The imageable element comprises one or more solvent-resistant polymer binders described herein at a dry coverage of from about 10 to 100 weight %. The amounts may differ depending upon the type of imageable element. For example, for the single-layer imageable elements of this invention, the amount of solvent-resistant polymer binders may be from about 5 to about 40 weight %, and preferably from about 10 to about 20 weight %. For the multi-layer imageable elements of this invention, the amount of solvent-resistant polymer binders may be from about 30 to about 90 weight %, and preferably from about 35 to about 75 weight %. All of these amounts are based on the total dry weight of the layer in which the polymer binders are located.

The solvent-resistant polymer binders useful in this invention can be prepared using known polymerization techniques depending upon the starting materials. If condensation polymers are prepared and used, the starting materials are generally dibasic carboxylic acids and dibasic alcohols, either of which can include the desired —N(R)—C(=X)—N(R')—$S(=O)_2$— moiety.

More preferably, the solvent-resistant polymers are prepared from ethylenically unsaturated polymerizable monomers using conditions, reactants, and catalysts suitable for free radical (or "addition") polymerization that are well known to those skilled in the art and that are described, for example, in Chapters 20 and 21, of *Macromolecules, Vol.* 2, 2nd Ed., H. G. Elias, Plenum, New York, 1984. Useful free radical initiators are peroxides such as benzoyl peroxide, hydroperoxides such as cumyl hydroperoxide and azo compounds such as 2,2'-azobis(isobutyronitrile) (AIBN). Suitable reaction solvents include liquids that are inert to the reactants and that will not otherwise adversely affect the reaction.

Single-Layer Imageable Elements

The single-layer imageable elements are positive-working and the solvent-resistant polymer binders described herein are present in the imaging layers of these elements. In general, the single-layer imageable elements are formed by suitable application of an imaging formulation containing one or more solvent-resistant polymer binders to a suitable substrate to form an imageable layer. This substrate is usually treated or coated in various ways as described below prior to application of the formulation. The substrate can be treated to provide an "interlayer" for improved adhesion or hydrophilicity, and the single imaging layer is applied over the interlayer.

The substrate generally has a hydrophilic surface, or at least a surface that is more hydrophilic than the applied imaging formulation on the imaging side. The substrate comprises a support that can be composed of any material that is conventionally used to prepare imageable elements such as lithographic printing plates. It is usually in the form of a sheet, film, or foil, and is strong, stable, and flexible and resistant to dimensional change under conditions of use so that color records will register a full-color image. Typically, the support can be any self-supporting material including polymeric films (such as polyester, polyethylene, polycarbonate, cellulose ester polymer, and polystyrene films), glass, ceramics, metal sheets or foils, or stiff papers (including resin-coated and metallized papers), or a lamination of any of these materials (such as a lamination of an aluminum foil onto a polyester film). Metal supports include sheets or foils of aluminum, copper, zinc, titanium, and alloys thereof.

Polymeric film supports may be modified on one or both surfaces with a "subbing" layer to enhance hydrophilicity, or paper supports may be similarly coated to enhance planarity. Examples of subbing layer materials include but are not limited to, alkoxysilanes, amino-propyltriethoxysilanes, glycidioxypropyl-triethoxysilanes, and epoxy functional polymers, as well as conventional hydrophilic subbing materials used in silver halide photographic films (such as gelatin and other naturally occurring and synthetic hydrophilic colloids and vinyl polymers including vinylidene chloride copolymers).

A preferred substrate is composed of an aluminum support that may be coated or treated using techniques known in the art, including physical graining, electrochemical graining, chemical graining, and anodizing. Preferably, the aluminum sheet is anodized using phosphoric acid or sulfuric acid and conventional procedures.

An optional interlayer may be formed by treatment of the aluminum support with, for example, a silicate, dextrine, calcium zirconium fluoride, hexafluorosilicic acid, sodium phosphate/sodium fluoride, poly(vinyl phosphonic acid) (PVPA), vinyl phosphonic acid copolymer, poly(acrylic acid), or acrylic acid copolymer. Preferably, the grained and/or anodized aluminum support is then treated with poly(acrylic acid) using known procedures to improve surface hydrophilicity.

The thickness of the substrate can be varied but should be sufficient to sustain the wear from printing and thin enough to wrap around a printing form. Preferred embodiments include a treated aluminum foil having a thickness of from about 100 to about 600 μm.

The backside (non-imaging side) of the substrate may be coated with antistatic agents and/or slipping layers or a matte layer to improve handling and "feel" of the imageable element.

The substrate can also be a cylindrical surface having the radiation-sensitive composition applied thereon, and thus be an integral part of the printing press. The use of such imaged cylinders is described for example in U.S. Pat. No. 5,713,287 (Gelbart).

The imageable layer comprises one or more of the solvent-resistant polymer binders (described above) and preferably one or more radiation absorbing compounds. While these compounds can be sensitive to any suitable energy form (for example, UV radiation), they are preferably sensitive to infrared radiation and thus, the radiation absorbing compounds are known as infrared radiation absorbing compounds ("IR absorbing compounds") that absorbs radiation from about 600 to about 1200 nm and preferably from about 700 to about 1200 nm. The imageable layer is generally the outermost layer in the single-layer imageable element.

Examples of suitable IR dyes include but are not limited to, azo dyes, squarylium dyes, croconate dyes, triarylamine dyes, thioazolium dyes, indolium dyes, oxonol dyes, oxazolium dyes, cyanine dyes, merocyanine dyes, phthalocyanine dyes, indocyanine dyes, indotricarbocyanine dyes, hemicyanine dyes, streptocyanine dyes, oxatricarbocyanine dyes, thiocyanine dyes, thiatricarbocyanine dyes, merocyanine dyes, cryptocyanine dyes, naphthalocyanine dyes, polyaniline dyes, polypyrrole dyes, polythiophene dyes, chalcogenopyryloarylidene and bi(chalcogenopyrylo)-polymethine dyes, oxyindolizine dyes, pyrylium dyes, pyrazoline azo dyes, oxazine dyes, naphthoquinone dyes, anthraquinone dyes, quinoneimine dyes, methine dyes, arylmethine dyes, polymethine dyes, squarine dyes, oxazole dyes, croconine dyes, porphyrin dyes, and any substituted or ionic form of the preceding dye classes. Suitable dyes are described for example, in U.S. Pat. No. 4,973,572 (DeBoer), U.S. Pat. No. 5,208,135 (Patel et al.), U.S. Pat. No. 5,244,771 (Jandrue Sr. et al.), and U.S. Pat. No. 5,401,618 (Chapman et al.), and EP 0 823 327A1 (Nagasaka et al.), all of which are incorporated herein by reference.

Cyanine dyes having an anionic chromophore are also useful. For example, the cyanine dye may have a chromophore having two heterocyclic groups. In another embodiment, the cyanine dye may have at least two sulfonic acid groups, more particularly two sulfonic acid groups and two indolenine groups. Useful IR-sensitive cyanine dyes of this type are described for example in U.S Patent Application Publication 2005-0130059 (Tao) that is incorporated by reference.

A general description of one class of suitable cyanine dyes is shown by the formula in paragraph 0026 of WO 2004/101280 (Munnelly et al.), incorporated herein by reference.

In addition to low molecular weight IR-absorbing dyes, IR dye moieties bonded to polymers can be used as well. Moreover, IR dye cations can be used as well, that is, the cation is the IR absorbing portion of the dye salt that ionically interacts with a polymer comprising carboxy, sulfo, phospho, or phosphono groups in the side chains.

Near infrared absorbing cyanine dyes are also useful and are described for example in U.S. Pat. No. 6,309,792 (Hauck et al.), U.S. Pat. No. 6,264,920 (Achilefu et al.), U.S. Pat. No. 6,153,356 (Urano et al.), U.S. Pat. No. 5,496,903 (Watanate et al.). Suitable dyes may be formed using conventional methods and starting materials or obtained from various commercial sources including American Dye Source (Baie D'Urfe, Quebec, Canada) and FEW Chemicals (Germany). Other useful dyes for near infrared diode laser beams are described, for example, in U.S. Pat. No. 4,973,572 (noted above).

Useful IR absorbing compounds include various pigments including carbon blacks such as carbon blacks that are surface-functionalized with solubilizing groups are well known in the art. Carbon blacks that are grafted to hydrophilic, nonionic polymers, such as FX-GE-003 (manufactured by Nippon Shokubai), or which are surface-functionalized with anionic groups, such as CAB-O-JET® 200 or CAB-O-JET® 300 (manufactured by the Cabot Corporation) are also useful. Other useful pigments include, but are not limited to, Heliogen Green, Nigrosine Base, iron (III) oxides, manganese oxide, Prussian Blue, and Paris Blue. The size of the pigment particles should not be more than the thickness of the imageable layer and preferably the pigment particle size will be less than half the thickness of the imageable layer.

The radiation absorbing compound can be present in the imageable element in an amount sufficient to render the imageable layer insoluble to an aqueous developer after exposure to appropriate radiation. This amount is generally at least 0.5% and up to 20 weight % and preferably from about 1 to about 10 weight % (based on total dry layer weight). Alternatively, the amount can be defined by an absorbance in the range of from about 0.05 to about 3, and preferably from about 0.1 to about 1.5, in the dry film as measured by reflectance UV-visible spectrophotometry. The particular amount needed for this purpose would be readily apparent to one skilled in the art, depending upon the specific compound used and the properties of the alkaline developer to be used.

Alternatively, the radiation absorbing compounds may be included in a separate layer that is in thermal contact with the imageable layer. Thus, during imaging, the action of the radiation absorbing compound can be transferred to the imageable layer without the compound originally being incorporated into it.

Preferably, the imageable layer includes one or more additional compounds that act as dissolution inhibitors that function as solubility-suppressing components for the alkali-soluble polymers. Dissolution inhibitors typically have polar functional groups that are believed to act as acceptor sites for hydrogen bonding with various groups in the polymeric binders. The acceptor sites comprise atoms with high electron density, preferably selected from electronegative first row elements such as carbon, nitrogen, and oxygen. Dissolution inhibitors that are soluble in the alkaline developer are preferred. Useful polar groups for dissolution inhibitors include but are not limited to, ether groups, amine groups, azo groups, nitro groups, ferrocenium groups, sulfoxide groups, sulfone groups, diazo groups, diazonium groups, keto groups, sulfonic acid ester groups, phosphate ester groups, triarylmethane groups, onium groups (such as sulfonium, iodonium, and phosphonium groups), groups in which a nitrogen atom is incorporated into a heterocyclic ring, and groups that contain a positively charged atom (such as quaternized ammonium group). Compounds that contain a positively-charged nitrogen atom useful as dissolution inhibitors include, for example, tetralkyl ammonium compounds and quaternized heterocyclic compounds such as quinolinium compounds, benzothiazolium compounds, pyridinium compounds, and imidazolium compounds. Further details and representative compounds useful as dissolution inhibitors are described for example in U.S. Pat. No. 6,294,311 (noted above). Particularly useful dissolution inhibitors include triarylmethane dyes such as ethyl violet, crystal violet, malachite green, brilliant green, Victoria blue B, Victoria blue R, and Victoria pure blue BO, BASONYL® Violet 610 and D11 (PCAS, Longjumeau, France). These compounds can also act as contrast dyes that distinguish the unimaged areas from the imaged areas in the developed imageable element.

When a dissolution inhibitor is present in the imageable layer, its amount can vary widely, but generally it is present in an amount of at least 0.5 weight % and up to 30 weight %, and preferably from about 1 to about 15 weight % (based on the total dry layer weight).

The imageable layer can also include one or more additional binder resins, with or without polar groups, or a mixture of binder resins, some with polar groups and others without polar groups. The most suitable additional binder resins include phenolic resins such as novolak and resole resins, and such resins can also include one or more pendant diazo, carboxylate ester, phosphate ester, sulfonate ester, sulfinate ester, or ether groups. The hydroxy groups of the phenolic resins can be converted to -T-Z groups in which T represents a polar group and Z represents a non-diazide functional group as described for example in U.S. Pat. No. 6,218,083 (McCullough et al.) and WO 99/001795 (McCullough et al.). The hydroxy groups can also be derivatized with diazo groups containing o-naphthoquinone diazide moieties as described for example in U.S. Pat. No. 5,705,308 (West et al.) and U.S. Pat. No. 5,705,322 (West et al.). These additional binder resins can be present in the imageable layer in an amount of from about 50 to about 90 weight % and preferably at from about 60 to about 85 weight % (based on total layer dry weight).

The imageable layer can further include a variety of additives including dispersing agents, humectants, biocides, plasticizers, surfactants for coatability or other properties, viscosity builders, dyes or colorants to allow visualization of the written image, pH adjusters, drying agents, defoamers, preservatives, antioxidants, development aids, rheology modifiers or combinations thereof, or any other addenda commonly used in the lithographic art, in conventional amounts.

The positive-working single-layer imageable element can be prepared by applying the layer formulation(s) over the surface of the substrate (and any other hydrophilic layers provided thereon) using conventional coating or lamination methods. Thus, the formulations can be applied by dispersing or dissolving the desired ingredients in a suitable coating solvent, and the resulting formulations are sequentially or simultaneously applied to the substrate using suitable equipment and procedures, such as spin coating, knife coating, gravure coating, die coating, slot coating, bar coating, wire rod coating, roller coating, or extrusion hopper coating. The formulations can also be applied by spraying onto a suitable support (such as an on-press printing cylinder).

The coating weight for said single imageable layer is from about 0.5 to about 2.5 $g/m^2$ and preferably from about 1 to about 2 $g/m^2$.

The selection of solvents used to coat the layer formulation(s) depends upon the nature of the polymeric materials and other components in the formulations. Generally, the imageable layer formulation is coated out of acetone or another ketone such as methyl ethyl ketone (MEK), tetrahydrofuran, 1-methoxypropan-2-ol, 1-methoxy-2-propyl acetate, and mixtures thereof using conditions and techniques well known in the art. One particularly useful solvent mixture includes MEK, γ-butyrolactone (BLO), 1-methoxypropan-2-ol (or Dowanol PM or PGME), and water.

Alternatively, the layer(s) may be applied by conventional extrusion coating methods from melt mixtures of the respective layer compositions. Typically, such melt mixtures contain no volatile organic solvents.

Intermediate drying steps may be used between applications of the various layer formulations to remove solvent(s) before coating other formulations. Drying steps may also help in preventing the mixing of the various layers.

Representative methods for preparing positive-working single-layer imageable elements of this invention are described below in Examples 1–3.

Multilayer Imageable Elements

In general, the multilayer imageable elements comprise a substrate, an inner layer (also known as an "underlayer"), and an outer layer (also known as a "top layer" or "topcoat") disposed over the inner layer. Before thermal imaging, the outer layer is not removable by an alkaline developer, but after thermal imaging, the imaged regions of the outer layer are removable by the alkaline developer. The inner layer is also removable by the alkaline developer. One or more solvent-resistant polymer binders having the —N(R)—C(═X)—N(R')—S(═O)$_2$— moiety (as described above) are present in the inner layer. An infrared radiation absorbing compound (defined below) is preferably present in the inner layer also and optionally present additionally in a separate layer between the inner and outer layers.

The multi-layer imageable elements are formed by suitable application of an inner layer composition to a suitable substrate that is described in detail above in relation to the single-layer imageable elements of this invention. This substrate can be an untreated or uncoated support but it is usually treated or coated in various ways as described below prior to application of the inner layer composition. The substrate generally has a hydrophilic surface or at least a surface that is more hydrophilic than the outer layer composition. Grained and anodized aluminum sheets are preferred substrates.

An interlayer between the support and inner layer may be formed by treatment of the aluminum support with, for example, a silicate, dextrine, calcium zirconium fluoride, hexafluorosilicic acid, sodium phosphate/sodium fluoride, poly(vinyl phosphonic acid) (PVPA), vinyl phosphonic acid copolymer, poly(acrylic acid), or acrylic acid copolymer. Preferably, the grained and anodized aluminum support is treated with PVPA using known procedures to improve surface hydrophilicity.

The inner layer is disposed between the outer layer and the substrate. It is disposed over the substrate and, more typically, disposed directly on the substrate. The inner layer comprises one or more of the solvent-resistant polymers described above and in an amount as described above. These polymers are preferably insoluble in the solvent used to coat the outer layer so that the outer layer can be coated over the inner layer without dissolving the inner layer.

The inner layer may also comprise one or more primary additional polymeric materials, provided these primary additional polymeric materials do not adversely affect the chemical resistance and solubility properties of the inner layer. Preferred primary additional polymeric materials, when present, are novolak resins that may be added to improve the run length of the printing member when a post-development bake process is used.

Useful primary additional polymeric materials for the inner layer include polyvinyl acetals, (meth)acrylic resins comprising carboxy groups, vinyl acetate crotonate-vinyl neodecanoate copolymer phenolic resins, maleated wood rosins, styrene-maleic anhydride co-polymers, (meth)acrylamide polymers, polymers derived from an N-substituted cyclic imide, and combinations thereof. Polymeric materials that provide resistance both to fountain solution and aggressive washes are disclosed in U.S. Pat. No. 6,294,311 (noted above) that is incorporated herein by reference.

Particularly useful primary additional polymeric materials include polyvinyl acetals, and copolymers derived from an N-substituted cyclic imide (especially N-phenylmaleimide), a (meth)acrylamide (especially methacrylamide), and a (meth)acrylic acid (especially methacrylic acid). The preferred polymeric materials of this type are copolymers that comprise from about 20 to about 75 mol % and preferably about 35 to about 60 mol % or recurring units derived from N-phenylmaleimide, N-cyclohexylmaleimide, N-benzylmaleimide, or a mixture thereof, from about 10 to about 50 mol % and preferably from about 15 to about 40 mol % of recurring units derived from acrylamide, methacrylamide, or a mixture thereof, and from about 5 to about 30 mol % and preferably about 10 to about 30 mol % of recurring units derived from methacrylic acid. Other hydrophilic monomers, such as hydroxyethyl methacrylate, may be used in place of some or all of the methacrylamide. Other alkaline soluble monomers, such as acrylic acid, may be used in place of some or all of the methacrylic acid. Optionally, these polymers can also include recurring units derived from (meth)acrylonitrile or N-[2-(2-oxo-1-imidazolidinyl)ethyl] methacrylamide. These polymeric materials are soluble in a methyl lactate/methanol/dioxolane (15:42.5:42.5 wt. %) mixture that can be used as the coating solvent for the inner layer. However, they are poorly soluble in solvents such as acetone and toluene that can be used as solvents to coat the outer layer over the inner layer without dissolving the inner layer.

Other useful primary additional polymeric materials include copolymers that comprises from about 1 to about 30 mol % and preferably from about 3 to about 20 mol % of recurring units derived from N-phenylmaleimide, from about 1 to about 30 mol % and preferably from about 5 to about 20 mol % of recurring units derived from methacrylamide, from about 20 to about 75 mol % and preferably from about 35 to about 60 mol % of recurring units derived from acrylonitrile, and from about 20 to about 75 mol % and preferably from about 35 to about 60 mol % of recurring units derived from one or more monomers of the following Structure (II):

$$CH_2{=}C(R_3){-}CO_2{-}CH_2CH_2{-}NH{-}CO{-}NH\text{-}p\text{-}C_6H_4{-}R_2 \quad \text{(II)}$$

wherein $R_2$ is OH, COOH, or $SO_2NH_2$, and $R_3$ is H or methyl, and, optionally, from about 1 to about 30 mol % and preferably, when present, from about 3 to about 20 mol % of recurring units derived from one or more monomers of the following Structure (III):

$$CH_2{=}C(R_5){-}CO{-}NH\text{-}p\text{-}C_6H_4{-}R_4 \quad \text{(III)}$$

wherein $R_4$ is OH, COOH, or $SO_2NH_2$, and $R_5$ is H or methyl.

The inner layer may also comprise one or more secondary additional polymeric materials that are resins having activated methylol and/or activated alkylated methylol groups. Such resins include, for example resole resins and their alkylated analogs, methylol melamine resins and their alkylated analogs (for example melamine-formaldehyde resins), methylol glycoluril resins and alkylated analogs (for example, glycoluril-formaldehyde resins), thiourea-formaldehyde resins, guanamine-formaldehyde resins, and benzoguanamine-formaldehyde resins. Commercially available melamine-formaldehyde resins and glycoluril-formaldehyde resins include, for example, CYMEL® resins (Dyno Cyanamid) and NIKALAC® resins (Sanwa Chemical).

The resin having activated methylol and/or activated alkylated methylol groups is preferably a resole resin or a mixture of resole resins. Resole resins are well known to those skilled in the art. They are prepared by reaction of a phenol with an aldehyde under basic conditions using an excess of phenol. Commercially available resole resins include, for example, GP649D99 resole (Georgia Pacific).

Other useful secondary additional polymeric materials can include copolymers that comprise from about 25 to about 75 mol % and about 35 to about 60 mol % of recurring units derived from N-phenylmaleimide, from about 10 to about 50 mol % and preferably from about 15 to about 40 mol % of recurring units derived from methacrylamide, and from about 5 to about 30 mol % and preferably from about 10 to about 30 mol % or recurring units derived from methacrylic acid. These secondary additional copolymers are disclosed in U.S. Pat. Nos. 6,294,311 and 6,528,228 (both noted above).

Any primary and secondary additional polymeric materials (such as a novolak, resole, or copolymers noted above) can be present in an amount of from about 5 to about 45 weight % and preferably from about 5 to about 25 weight % based on the total dry weight of the inner layer.

The primary and secondary additional polymeric materials useful in the inner layer can be prepared by methods, such as free radical polymerization, that are well known to those skilled in the art and that are described, for example, in Chapters 20 and 21, of *Macromolecules*, Vol. 2, 2nd Ed., H. G. Elias, Plenum, New York, 1984. Useful free radical initiators are peroxides such as benzoyl peroxide, hydroperoxides such as cumyl hydroperoxide and azo compounds such as 2,2'-azobis(isobutyronitrile) (AIBN). Suitable reaction solvents include liquids that are inert to the reactants and that will not otherwise adversely affect the reaction.

In preferred embodiments, the inner layer further comprises an infrared radiation absorbing compound ("IR absorbing compounds") that absorbs radiation at from about 600 to about 1200 and preferably at from about 700 to about 1200 nm, with minimal absorption at from about 300 to about 600 nm. This compound (sometimes known as a "photothermal conversion material") absorbs radiation and converts it to heat. Although one of the polymeric materials may itself comprise an IR absorbing moiety, typically the infrared radiation absorbing compound is a separate compound. This compound may be either a dye or pigment (including carbon blacks). Examples of useful carbon blacks are ProJet 900, ProJet 860 and ProJet 830 (all available from the Zeneca Corporation). Carbon blacks and particularly useful IR absorbing dyes ("IR dyes") are described above in the description of the single-layer imageable elements.

The radiation absorbing compound can be present in multilayer imageable elements in an amount of generally at least 8% and up to 30% and preferably from about 8 to about 25%, based on the total inner layer dry weight. The particular amount of a given IR absorbing compound to be used could be readily determined by one skilled in the art.

The inner layer can include other components such as surfactants, dispersing aids, humectants, biocides, viscosity builders, drying agents, defoamers, preservatives, antioxidants, and colorants.

The inner layer generally has a dry coating coverage of from about 0.5 to about 2.5 $g/m^2$ and preferably from about 1 to about 2 $g/m^2$.

The outer layer of the imageable element is disposed over the inner layer and in preferred embodiments there are no intermediate layers between the inner and outer layers. The outer layer comprises a polymeric material that is a light-stable, water-insoluble, alkaline developer soluble, film-forming binder material such as phenolic resins, urethane resins, and polyacrylates. The outer layer is generally substantially free of infrared radiation absorbing compounds, meaning that none of these compounds are purposely incorporated therein and insubstantial amounts diffuse into it from other layers. Particularly useful binder materials are described for example in U.S. Pat. No. 6,352,812 (noted above), U.S. Pat. No. 6,358,669 (noted above), U.S. Pat. No. 6,352,811 (noted above), U.S. Pat. No. 6,294,311 (noted above), U.S. Pat. No. 6,893,783 (Kitson et al.), and U.S. Pat. No. 6,645,689 (Jarek), U.S. Patent Application Publications 2003/0108817 (Patel et al) and 2003/0162,126 (Kitson et al.), and WO 2005/018934 (Kitson et al.), all of which are incorporated herein by reference.

Particularly useful film-forming binder materials for the outer layer are phenolic resins or hydroxy-containing polymers containing phenolic monomeric units that can be random, alternating, block, or graft copolymers of different monomers and may be selected from polymers of vinyl phenol, novolak resins, or resole resins. Novolak resins are preferred. The novolak or resole resins can be prepared using conventional starting materials (a hydroxy aromatic hydrocarbon and an aldehyde or ketone) and reaction conditions. The weight average molecular weight ($M_w$), measured using gel permeation chromatography using standard calibration and polystyrene standards, of the novolak resins is from about 500 to about 150,000 g/mol, and more preferably from about 1,500 to about 15,000 g/mol.

Useful poly(vinyl phenol) resins can be polymers of one or more hydroxyphenyl containing monomers such as hydroxystyrenes and hydroxyphenyl (meth)acrylates. Other monomers not containing hydroxy groups can be copolymerized with the hydroxy-containing monomers. These resins can be prepared by polymerizing one or more of the monomers in the presence of a radical initiator or a cationic polymerization initiator using known reaction conditions. The weight average molecular weight ($M_w$) of these polymers, measured as described above for the novolak resins, of the novolak resins is from about 1000 to about 200,000 g/mol, and more preferably from about 1,500 to about 50,000 g/mol.

Examples of useful hydroxy-containing polymers include ALNOVOL SPN452, SPN400, HPN100 (Clariant GmbH), DURITE PD443, SD423A, SD126A, PD494A, PD-140 (Hexion Specialty Chemicals, Columbus, Ohio), BAKELITE 6866LB02, AG, 6866LB03 (Bakelite AG), KR 400/8 (Koyo Chemicals Inc.), HRJ 1085 and 2606 (Schenectady International, Inc.), and Lyncur CMM (Siber Hegner), all of which are described in U.S. Patent Application Publication 2005/0037280 (noted above). Particularly useful polymers that can be modified as described above PD-140 and PD-494A described for use in the Examples below.

It is also possible to include in the outer layer one or more "modified" phenolic resin binders that comprise phenolic recurring units that are substituted by the group represented by Structure (Q) shown as follows:

(Q)

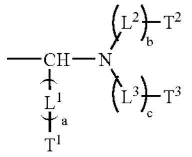

wherein $L^1$, $L^2$, and $L^3$ independently represent linking groups, $T^1$, $T^2$, and $T^3$ independently represent terminal groups, and a, b, and c are independently 0 or 1.

More particularly, each of $L^1$, $L^2$, and $L^3$ are independently a substituted or unsubstituted alkylene having 1 to 4 carbon atoms (such as methylene, 1,2-ethylene, 1,1-ethylene, n-propylene, iso-propylene, t-butylene, and n-butylene groups), substituted cycloalkylene having 5 to 7 carbon atoms in the cyclic ring (such as cyclopentylene and 1,4-cyclohexylene), substituted or unsubstituted arylene having 6 to 10 carbon atoms in the aromatic ring (such as 1,4-phenylene, naphthylene, 2-methyl-1,4-phenylene, and 4-chloro-1,3-phenylene groups), or substituted or unsubstituted, aromatic or non-aromatic divalent heterocyclic group having 5 to 10 carbon and one or more heteroatoms (nitrogen, oxygen, or sulfur atoms) in the cyclic ring (such as pyridylene, pyrazylene, pyrimidylene, or thiazolylene groups), or any combinations of two or more of these divalent linking groups. Alternatively, $L^2$ and $L^3$ together can represent the necessary atoms to form a carbocyclic or heterocyclic ring structure. Preferably, $L^1$ is a carbon-hydrogen single bond or a methylene, ethylene, or phenylene group, and $L^2$ and $L^3$ are independently hydrogen, methyl, ethyl, 2-hydroxyethyl, or cyclic $-(CH_2)_2O(CH_2CH_2)-$ groups.

$T^1$, $T^2$, and $T^3$ are independently terminal groups such as hydrogen, or substituted or unsubstituted alkyl groups having 1 to 10 carbon atoms (such as methyl, ethyl, iso-propyl, t-butyl, n-hexyl, methoxymethyl, phenylmethyl, hydroxyethyl, and chloroethyl groups), substituted or unsubstituted alkenyl groups having 2 to 10 carbon atoms (such as ethenyl and hexenyl groups), substituted or unsubstituted alkynyl groups (such as ethynyl and octynyl groups), substituted or unsubstituted cycloalkyl groups having 5 to 7 carbon atoms in the cyclic ring (such as cyclopentyl, cyclohexyl, and cycloheptyl groups), substituted or unsubstituted heterocyclic groups (both aromatic and non-aromatic) having a carbon atom and one or more heteroatoms in the ring (such as pyridyl, pyrazyl, pyrimidyl, thiazolyl, and indolyl groups), and substituted or unsubstituted aryl groups having 6 to 10 carbon atoms in the aromatic ring (such as phenyl, naphthyl, 3-methoxyphenyl, benzyl, and 4-bromophenyl groups). Alternatively, $T^2$ and $T^3$ together represent the atoms necessary to form a cyclic structure that can also contain fused rings.

In addition, when a is 0, $T^3$ is not hydrogen.

The $L^1$, $L^2$, $L^3$, $T^1$, $T^2$, and $T^3$ groups defined above can be substituted with one or more substituents such as $-OR^{11}$, $-SR^{11}$, $-CO-OR^{11}$, $-OCOR^{11}$, $-COR^{11}$, $-SO_2R^{11}$, $-SO_2R^{11}$, cyano, nitro, halo, phosphate, phosphonate, amino, amido, imido, sulfonamido groups wherein $R^{11}$ is defined similarly to $T^1$–$T^3$ noted above.

Preferably, a is 0 and b and c are each 1. More preferably, a is 0 and $T^1$ is hydrogen. In another more preferred embodiment, $T^2$ and/or $T^3$ comprise a 5- to 6-membered heteroaromatic group.

This modified phenolic resin binder can be prepared by the reaction of a phenolic monomeric unit with a first compound comprising an aldehyde group and a second compound comprising an amine group. Useful first compounds are listed as Compounds AL-01 to AL-20 in U.S. Patent Application Publication 2005/0037280 (noted above), incorporated herein by reference. In preferred embodiments, the first compound is formaldehyde, propionaldehyde, or benzaldehyde.

Useful amine compounds are linear or cyclic primary or secondary amines such as those described as Compounds AM-01 to AM-27 in U.S. Patent Application Publication 2005/0037280 (noted above). Preferred amine compounds include morpholine, ethanolamine, and benzylamine.

The modified phenolic resin binder can contain more than one type of substituted Structure (Q) group. The different Structure (Q) groups can be incorporated successively or as a mixture of different first and second compounds in the reaction with the hydroxy-containing polymer. The amount and type of Structure (Q) group is limited only by the solubility of the resulting modified phenolic resin binder in the alkaline developer. If present in the outer layer, generally at least 0.5 mol % and up to 50 mol % of the modified phenolic resin binder recurring units comprise the same or different Structure (Q) groups. Preferably, the Structure (O) groups are present in from about 1 to about 40 mol %.

The Structure (Q) group described above is the predominant substituent in the modified phenolic resin binders. However, some of the Structure (Q) groups in the polymer chain may be present in quaternized form, for example, as a result of reaction with a strong acid such as sulfuric acid or hydrochloric acid or with an alkyl halide.

The outer layer can also include non-phenolic polymeric materials as film-forming binder materials in addition to or instead of the phenolic resins described above. Such non-phenolic polymeric materials include polymers formed from maleic anhydride and one or more styrenic monomers (that is styrene and styrene derivatives having various substituents on the benzene ring), polymers formed from methyl methacrylate and one or more carboxy-containing monomers, and mixtures thereof. These polymers can comprises recurring units derived from the noted monomers as well as recurring units derived from additional, but optional monomers [such as (meth)acrylates, (meth)acrylonitriles and (meth)acrylamides].

In some, but not all, embodiments, the outer layer further includes a monomeric or polymeric compound that includes a benzoquinone diazide and/or naphthoquinone diazide moiety. The polymeric compounds can be phenolic resins derivatized with a benzoquinone diazide and/or naphthoquinone diazide moiety as described for example in U.S. Pat. No. 5,705,308 (West et al.) and U.S. Pat. No. 5,705,322 (West et al.) that are incorporated by reference. Mixtures of such compounds can also be used. An example of a useful polymeric compound of this type is P-3000, a naphthoquinone diazide of a pyrogallol/acetone resin (available from PCAS, France). Other useful compounds containing diazide moieties are described for example in U.S. Pat. No. 6,294,311 (noted above) and U.S. Pat. No. 5,143,816 (Mizutani et al.) that are incorporated by reference.

The monomeric or polymeric compound having a benzoquinone and/or naphthoquinone diazide moiety can be present in the outer layer generally in an amount of at least 5%, and preferably from about 10 to about 50%, based on total dry weight of the outer layer.

The outer layer can optionally include additional compounds that are colorants that may function as solubility-suppressing components for the alkali-soluble polymers. These colorants typically have polar functional groups that are believed to act as acceptor sites for hydrogen bonding with various groups in the polymeric binders. Colorants that are soluble in the alkaline developer are preferred. Useful polar groups include but are not limited to, diazo groups, diazonium groups, keto groups, sulfonic acid ester groups, phosphate ester groups, triarylmethane groups, onium groups (such as sulfonium, iodonium, and phosphonium groups), groups in which a nitrogen atom is incorporated into a heterocyclic ring, and groups that contain a positively charged atom (such as quaternized ammonium group). Further details and representative colorants are described for example in U.S. Pat. No. 6,294,311 (noted above). Particularly useful colorants include triarylmethane dyes such as ethyl violet, crystal violet, malachite green, brilliant green, Victoria blue B, Victoria blue R, and Victoria pure blue BO. These compounds can act as contrast dyes that distinguish the unimaged areas from the imaged areas in the developed imageable element.

When a colorant is present in the outer layer, its amount can vary widely, but generally it is present in an amount of at least 0.1% and up to 30%, and preferably from about 0.5 to about 15%, based on the total dry weight of the outer layer.

The outer layer can optionally also include printout dyes, surfactants, dispersing aids, humectants, biocides, viscosity builders, drying agents, defoamers, preservatives, and anti-oxidants.

The outer layer generally has a dry coating coverage of from about 0.2 to about 1 $g/m^2$ and preferably from about 0.4 to about 0.7 $g/m^2$.

Although not preferred, there may be a separate layer that is in between and in contact with the inner and outer layers. This separate layer can act as a barrier to minimize migration of radiation absorbing compound(s) from the inner layer to the outer layer. This separate "barrier" layer generally comprises a polymeric material that is soluble in the alkaline developer. If this polymeric material is different from the polymeric material(s) in the inner layer, it is preferably soluble in at least one organic solvent in which the inner layer polymeric materials are insoluble. A preferred polymeric material of this type is a poly(vinyl alcohol). Generally, this barrier layer should be less than one-fifth as thick as the inner layer, and preferably less than one-tenth as thick as the inner layer.

The imageable element can be prepared by sequentially applying an inner layer formulation over the surface of the substrate (and any other hydrophilic layers provided thereon), and then applying an outer layer formulation over the inner layer using conventional coating or lamination methods. It is important to avoid intermixing the inner and outer layer formulations.

The inner and outer layers can be applied by dispersing or dissolving the desired ingredients in a suitable coating solvent, and the resulting formulations are sequentially or simultaneously applied to the substrate using suitable equipment and procedures, such as spin coating, knife coating, gravure coating, die coating, slot coating, bar coating, wire rod coating, roller coating, or extrusion hopper coating. The formulations can also be applied by spraying onto a suitable support (such as an on-press printing cylinder).

The selection of solvents used to coat both the inner and outer layers depends upon the nature of the polymeric materials and other components in the formulations. To prevent the inner and outer layer formulations from mixing or the inner layer from dissolving when the outer layer formulation is applied, the outer layer formulation should be coated from a solvent in which the polymeric materials of the inner layer are insoluble. Generally, the inner layer formulation is coated out of a solvent mixture of methyl ethyl ketone (MEK), 1-methoxypropan-2-ol (PGME or Dowanol PM), γ-butyrolactone (BLO), and water, a mixture of diethyl ketone (DEK), water, methyl lactate, and γ-butyrolactone, or a mixture of DEK, water, and methyl lactate. The outer layer formulation is generally coated out of DEK or a mixture of DEK and 1-methoxy-2-propyl acetate (PMA).

Alternatively, the inner and outer layers may be applied by conventional extrusion coating methods from melt mixtures of the respective layer compositions. Typically, such melt mixtures contain no volatile organic solvents.

Intermediate drying steps may be used between applications of the various layer formulations to remove solvent(s) before coating other formulations. Drying steps may also help in preventing the mixing of the various layers.

Representative methods for preparing multi-layer imageable elements of this invention are described below in Examples 4–6.

Imaging Conditions

The single-layer and multi-layer imageable elements of this invention can have any useful form including, but not limited to, printing plate precursors, printing cylinders, printing sleeves and printing tapes (including flexible printing webs). Preferably, the imageable members are printing plate precursors.

Printing plate precursors can be of any useful size and shape (for example, square or rectangular) having the requisite imageable layer(s) disposed on a suitable substrate. Printing cylinders and sleeves are known as rotary printing members having the substrate and imageable layer in a cylindrical form. Hollow or solid metal cores can be used as substrates for printing sleeves.

During use, the single-layer and multi-layer imageable elements are exposed to a suitable source of radiation such as near-infrared or infrared radiation, depending upon the radiation absorbing compound present in the radiation-sensitive composition, at a wavelength of from about 700 to about 1500 nm. Preferably, imaging is carried out using an infrared laser at a wavelength of from about 700 to about 1200 nm. The laser used to expose the imaging member is preferably a diode laser, because of the reliability and low maintenance of diode laser systems, but other lasers such as gas or solid-state lasers may also be used. The combination of power, intensity and exposure time for laser imaging would be readily apparent to one skilled in the art. Presently, high performance lasers or laser diodes used in commercially available imagesetters emit infrared radiation at a wavelength of from about 800 to about 850 nm or from about 1060 to about 1120 nm.

The imaging apparatus can function solely as a platesetter or it can be incorporated directly into a lithographic printing press. In the latter case, printing may commence immediately after imaging, thereby reducing press set-up time considerably. The imaging apparatus can be configured as a flatbed recorder or as a drum recorder, with the imageable member mounted to the interior or exterior cylindrical surface of the drum. A useful imaging apparatus is available as models of Creo Trendsetter® imagesetters available from Eastman Kodak Company (Burnaby, British Columbia, Canada) that contain laser diodes that emit near infrared radiation at a wavelength of about 830 nm. Other suitable imaging sources include the Crescent 42T Platesetter that operates at a wavelength of 1064 nm and the Screen PlateRite 4300 series or 8600 series platesetter (available from Screen, Chicago, Ill.). Additional useful sources of radiation include direct imaging presses that can be used to image an element while it is attached to the printing plate cylinder. An example of a suitable direct imaging printing press includes the Heidelberg SM74-DI press (available from Heidelberg, Dayton, Ohio).

Imaging speeds may be in the range of from about 50 to about 1500 mJ/cm$^2$, and more particularly from about 75 to about 400 mJ/cm$^2$.

While laser imaging is preferred in the practice of this invention, imaging can be provided by any other means that provides thermal energy in an imagewise fashion. For example, imaging can be accomplished using a thermoresistive head (thermal printing head) in what is known as "thermal printing", described for example in U.S. Pat. No. 5,488,025 (Martin et al.). Thermal print heads are commercially available for example, as Fujitsu Thermal Head FTP-040 MCS001 and TDK Thermal Head F415 HH7-1089.

Imaging is generally carried out by direct digital imaging. The image signals are stored as a bitmap data file on a computer. Such files may be generated by a raster image processor (RIP) or other suitable means. The bitmaps are constructed to define the hue of the color as well as screen frequencies and angles.

Imaging of the imageable element produces an imaged element that comprises a latent image of imaged (exposed) and non-imaged (non-exposed) regions. Developing the imaged element with a suitable alkaline developer removes the exposed regions of the outermost layer and any other layers (including the inner layer) underneath it, and exposing the hydrophilic surface of the substrate. Thus, such imageable elements are "positive-working" (for example, "positive-working" lithographic printing plate precursors). The exposed (or imaged) regions of the hydrophilic surface repel ink while the unexposed (or non-imaged) regions of the outer layer accept ink.

More particularly for positive-working elements, development is carried out for a time sufficient to remove the imaged (exposed) regions of the outer layer and any underlying layers (for example, the inner layer), but not long enough to remove the non-imaged (non-exposed) regions of the outer layer. Thus, the imaged (exposed) regions of the outer layer are described as being "soluble" or "removable" in the alkaline developer because they are removed, dissolved, or dispersed within the alkaline developer more readily than the non-imaged (non-exposed) regions of the outer layer. Thus, the term "soluble" also means "dispersible".

The imaged elements are generally developed using conventional processing conditions. Both aqueous alkaline developers and solvent-based alkaline developers can be used with the latter type of alkaline developers being preferred.

Aqueous alkaline developers generally have a pH of at least 7 and preferably of at least 11. The higher pH developers are generally best for processing the single-layer elements. Useful alkaline aqueous developers include 3000 Developer, 9000 Developer, GoldStar® Developer, Goldstar® Plus Developer, GREENSTAR Developer, ThermalPro Developer, PROTHERM Developer, MX1813 Developer, and MX1710 Developer (all available from Kodak Polychrome Graphics a subsidiary of Eastman Kodak Company). These compositions also generally include surfactants, chelating agents (such as salts of ethylenediaminetetraacetic acid), and alkaline components (such as inorganic metasilicates, organic metasilicates, hydroxides, and bicarbonates).

Solvent-based alkaline developers are generally single-phase solutions of one or more organic solvents that are miscible with water. Useful organic solvents include the reaction products of phenol with ethylene oxide and propylene oxide [such as ethylene glycol phenyl ether (phenoxyethanol)], benzyl alcohol, esters of ethylene glycol and of propylene glycol with acids having 6 or less carbon atoms, and ethers of ethylene glycol, diethylene glycol, and of propylene glycol with alkyl groups having 6 or less carbon atoms, such as 2-ethylethanol and 2-butoxyethanol. The organic solvent(s) is generally present in an amount of from about 0.5 to about 15% based on total developer weight.

Representative solvent-based alkaline developers include ND-1 Developer, 955 Developer and 956 Developer (available from Kodak Polychrome Graphics a subsidiary of Eastman Kodak Company).

In some embodiments, the single-layer imageable elements are developed using high pH, aqueous alkaline developers and the multi-layer imageable elements are developed using solvent-based alkaline developers.

Generally, the alkaline developer is applied to the imaged element by rubbing or wiping the outer layer with an applicator containing the developer. Alternatively, the imaged element can be brushed with the developer or the developer may be applied by spraying the outer layer with sufficient force to remove the exposed regions. Still again, the imaged element can be immersed in the developer. In all instances, a developed image is produced in a lithographic printing plate having excellent resistance to press room chemicals.

Following development, the imaged element can be rinsed with water and dried in a suitable fashion. The dried element can also be treated with a conventional gumming solution (preferably gum arabic).

The imaged and developed element can also be baked in a postbake operation that can be carried out to increase run length of the resulting imaged element. Baking can be carried out, for example at from about 220° C. to about 240° C. for from about 7 to about 10 minutes, or at about 120° C. for 30 minutes.

Printing can be carried out by applying a lithographic ink and fountain solution to the printing surface of the imaged element. The ink is taken up by the non-imaged (non-exposed or non-removed) regions of the outermost layer and the fountain solution is taken up by the hydrophilic surface of the substrate revealed by the imaging and development process. The ink is then transferred to a suitable receiving material (such as cloth, paper, metal, glass, or plastic) to provide a desired impression of the image thereon. If desired, an intermediate "blanket" roller can be used to transfer the ink from the imaged member to the receiving material. The imaged members can be cleaned between impressions, if desired, using conventional cleaning means and chemicals.

The following examples are provided to illustrate the practice of the invention but are by no means intended to limit the invention in any manner.

EXAMPLES

The components and materials used in the examples and analytical methods were as follows:

MEK is methyl ethyl ketone.

DEK is diethyl ketone.

DAA is diacetone alcohol.

PMA is 1-methoxy-2-propyl acetate.

BLO is γ-butyrolactone.

956 Developer is an organic solvent-based (phenoxyethanol) alkaline developer (Kodak Polychrome Graphics, Norwalk, Conn., a subsidiary of Eastman Kodak Company).

GoldStar® Plus Developer is a metasilicate-containing developer (Kodak Polychrome Graphics).

IR Dye A is 2-[2-[2-chloro-3-[(1,3-dihydro-1,3,3-trimethyl-2H-indol-2-ylidene)ethylidene]-1-cyclohexen-1-yl]ethenyl]-1,3,3-trimethyl-3H-indolium bromide (Honeywell Specialty Chemicals, Morristown, N.J.).

IR Dye B was obtained from Eastman Kodak Company and is represented by the following formula:

IR Dye B

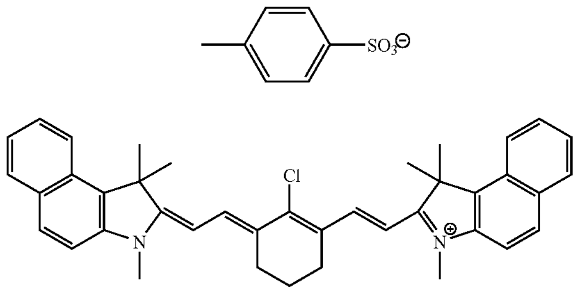

IR Dye C is Kayasorb PS210CNE (Nippon Kayaku Co., Ltd., Japan).

IR Dye D was obtained from Eastman Kodak Company and has the following formula:

IR Dye D

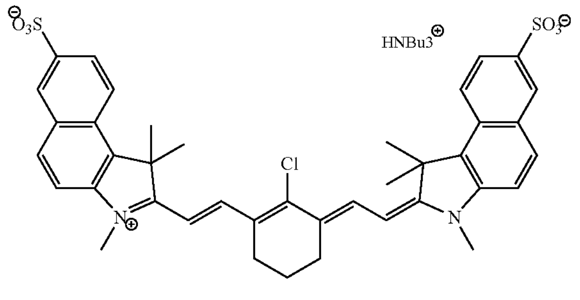

Ethyl violet is C.I. 42600 (CAS 2390-59-2, $\lambda_{max}$=596 nm) having a formula of $(p-(CH_3CH_2)_2NC_6H_4)_3C^+ Cl^-$ (Aldrich Chemical Company, Milwaukee, Wis., USA).

Crystal Violet is C.I. 42555, Basic Violet 3 with $\lambda_{max}$=588 nm.

P3000 is the reaction product of 1,2-naphthaquinone-5-sulfonyl chloride with pyrogallol acetone condensate (PCAS, Longjumeau, France).

LB 6564 is a phenol/cresol novolac resin (Rutgers-Plenco LLC, Sheboygan, Wis.).

PD494A is a novolac resin, 53% m-cresol/47% p-cresol, MW 8,000 (Hexion Specialty Chemicals, Columbus, Ohio).

Durez 33816 is a novolac resin, 70% m-cresol/30% p-cresol (Durez-Sumitomo, Grand Island, N.Y.).

PD-140 is a cresol/formaldehyde novolac resin, 75:25 m-cresol/-p-cresol (Hexion Specialty Chemicals, Columbus, Ohio).

DHBP is 2,4-dihydroxy benzophenone (Aldrich Chemical Company, Milwaukee, Wis.).

CAHPh is cellulose acetate hydrogen phthalate (Aldrich Chemical Company)

Byk® 307 is a polyethoxylated dimethylpolysiloxane copolymer in a 25 wt. % xylene/methoxypropyl acetate solution (Byk Chemie, Wallingford, Conn.).

Silikophen P50X is a phenylmethyl polysiloxane (from Tego Chemie Service, Essen, Germany).

JK58 is poly(N-phenylmaleimide-co-methacrylamide-co-methacrylic acid)(50/35/15 mol ratio) (Clariant, Germany).

Substrate A was a 0.3 mm gauge aluminum electrograined and anodized sheet that had then been treated with polyvinylphophonic acid.

Daicure UV wash was obtained from Dainippon Ink & Chemicals (Chuo-ku, Tokyo, Japan).

Preparation of Copolymer 1:

Intermediate Step:

N—N-Dimethylformamide (203.0 g), p-toluene sulfonamide (69.86 g) and $CuCl_2$ $2H_2O$ (3.41 g) were charged into a 1000 ml 4-neck ground glass flask, equipped with a heating mantle, temperature controller, mechanical stirrer, condenser, pressure equalized addition funnel and nitrogen inlet. Isocyanato ethyl methyl acrylate (IEM, 62.06 g) was added under nitrogen atmosphere at room temperature over a period of one hour, the reaction mixture was exothermed to 34° C. The reaction mixture was heated to 40° C. and the reaction was completed in four hours. Completion of reaction was determined by the disappearance of isocyanate infrared absorption band at 2275 $cm^{-1}$. At the end of the reaction, methanol (13 g) was added. The resulting Intermediate was isolated in powder form using water/ice and again the powder was re-dissolved in water until the blue color disappeared. The Intermediate product had an acid number of 174.5

Final Product Step:

Dimethylacetamide (41.4 g), Intermediate (8.0 g), acrylonitrile (4.5 g), N-phenyl maleimide (1.5 g), methacrylamide (0.7 g) and AIBN (0.15 g) [Vazo-64, from Dupont de Nemours Co] were added to a 500 ml 4-neck ground glass flask, equipped with a heating mantle, temperature controller, mechanical stirrer, condenser, pressure equalized addition funnel, and nitrogen inlet. Nitrogen was kept over the reaction mixture that was heated to 80° C. Then, a premixture of dimethylacetamide (100.0 g), Intermediate (25.0 g), acrylonitrile (13.5 g), N-phenyl maleimide (4.5 g), methacrylamide (2.3 g), and AIBN (0.3 g) was added over two hours at 80° C. Reaction was continued another sixteen hours and during processing two more times 0.5 g of Vazo-64 was added. The resulting polymer conversion was >94% based on determination of percent of non-volatiles. The viscosity was (G.H'33) C+ (~90 cps) at 30% non-volatile in DMAc. The weight ratio of the urea adduct of IEM/p-toluene sulfonamide (intermediate)/acrylonitrile/phenyl maleimide/methacrylamide was 55/30/10/5 percent by weight. The resulting "Copolymer" was isolated in powder form using water/ice using a lab dispersator (Model

84, series 2000) at 4000 rpm. Copolymer 1 was dried in oven over night and the finished product had acid number of 95.0.

Preparation of Copolymer 2:

Copolymer 2 was prepared similarly to Copolymer 1 except that the proportion of reactive monomers was modified so that the final product was approximately IEM/p-toluene sulfonamide (intermediate)/acrylonitrile/phenyl maleimide/methacrylamide 36/34/10/20 percent by weight.

Examples 1–3

Single-Layer Imageable Elements

The imaging layer coating formulations (6.25% solids) are described in the following TABLE I and were prepared as solutions in MEK/PGME/BLO/water (65:15:10:10) for the Example 1–3 elements and the Control A element, and in MEK/PGME (20:80) for the Control B element. The concentrations of components were selected to provide a dry coating weight of 1.5 g/m$^2$ onto a grained and anodized aluminum substrate using a Meyer coating bar. The layers were dried at a temperature of 123° C. for 50 seconds to remove coating solvent(s). The resulting elements were then heat treated at a temperature of 55° C. and a relative humidity of 80% RH for 3 days.

TABLE I

| Component | Example 1 | Example 2 | Example 3 | Control A | Control B |
|---|---|---|---|---|---|
| LB6564 | 35 | 35 | 32 | 63.3 | 63.3 |
| PD494A | 0 | 0 | 0 | 24.8 | 24.8 |
| Durez 33816 | 34.4 | 42 | 38.8 | 0 | 0 |
| Copolymer 1 | 15 | 15 | 0 | 0 | 0 |
| Copolymer 2 | 0 | 0 | 15 | 0 | 0 |
| CAHPh | 0 | 0 | 0 | 2.0 | 2.0 |
| DHBP | 5.5 | 4.0 | 4.0 | 0 | 0 |
| Crystal violet | 1.9 | 1.9 | 1.9 | 2 | 2 |
| IR Dye A | 0.45 | 0.45 | 0.45 | 0.5 | 0.5 |
| IR Dye B | 1.4 | 1.4 | 1.4 | 1.0 | 1.0 |
| Silikophen P50X | 6 | 0 | 6 | 6 | 6 |
| Byk ® 307 | 0.4 | 0.4 | 0.4 | 0.4 | 0.4 |

The imageable elements were evaluated using the following test methods:

To evaluate imaging speed, the elements were imaged using a Creo Trendsetter 3244 (Creo Inc. Burnaby, British Columbia, Canada). Following exposure, the imaged elements were developed using a commercially available Mercury of the Americas processor (Kodak Polychrome Graphics, a subsidiary of Eastman Kodak Company), containing GoldStar® Plus developer at 23° C. at a processing speed of 750 nm/min. The imaging of the elements was defined as the level of exposure (as measured in mJ/cm$^2$) that was required to clean out a region of 50% checkerboard pattern. Clean out was assessed using a D196 densitometer (Gretag MacBeth, Regensdorf, Switzerland).

Developer resistance (resistance to image attack) was assessed by measuring the optical density of a solid region of coating with a D196 densitometer before and after exposure to the developer at the noted processing conditions. The values quoted are the loss in optical density or ΔOD.

Solvent resistance was measured in a similar manner to developer resistance, that is, by measuring the ΔOD of a solid area. However, in this test the element was exposed to a concentrated fountain solution comprising:

1. 6 wt. % Astro Mark 3 fountain additive (Nikken Chemical Ltd, Tokyo, Japan),
2. 10 wt. % iso-propyl alcohol (Sigma-Aldrich St Louis, Mo.), and
3. 84 wt. % reverse osmosis purified water.

The ΔOD was measured between a solid area after development and a solid area that had been developed and then exposed to the fountain solution for 8 and 24 hours.

The results of these tests are shown in the following TABLE II.

TABLE II

| Formulation | Speed (mJ/cm$^2$) | Developer Resistance | Solvent resistance (8 hours) | Solvent resistance (24 hours) |
|---|---|---|---|---|
| Example 1 | 135 | −0.53 | −0.12 | −0.40 |
| Example 2 | 170 | −0.24 | −0.02 | −0.35 |
| Example 3 | 130 | −0.46 | −0.11 | −0.35 |
| Control A | 170 | −0.25 | −0.23 | −0.86 |
| Control B | 160 | −0.45 | −0.16 | −0.71 |

Examples 4–6

Multi-Layer Imageable Elements

Multi-layer elements of the invention were prepared with the components shown in TABLE III to provide 4–6 inner coating formulations and a single outer layer coating formulation (amounts in weight %). The outer layer coating was the same for all elements.

TABLE III

| Inner layer formulation based on 100 g of coating solution with 7% non-volatiles | | | | | | |
|---|---|---|---|---|---|---|
| Formulation | JK58 | Copolymer | IR Dye C | IR Dye D | Byk ® 307 (10% DEK) | Solvent* |
| 4 | 5.695 | | 0.7 | 0.56 | 0.455 | 92.59 |
| 5 | 2.895 | 2.800 | 0.7 | 0.56 | 0.455 | 92.59 |
| 6 | | 5.695 | 0.7 | 0.56 | 0.455 | 92.59 |

| Outer layer formulation based on 100 g of coating solution with 7% non-volatiles | | | | |
|---|---|---|---|---|
| PD140 | P3000 | Ethyl Violet (1% acetone) | Byk ® 307 (10% DEK) | Solvent** |
| 4.830 | 2.100 | 1.400 | 0.560 | 91.110 |

*Coating solvent of MEK/PGME/BLO/Water (50/30/10/10)
**Coating solvent of DEK/PMA (92/8)

Each inner layer formulation was applied to Substrate A with a 0.012 inch (0.03 cm) wire-wound bar to provide a dry coating weight of about 1.5 g/m$^2$. The coatings were dried for 35 seconds at 135° C.

The outer layer formulation was applied over the dried inner layer with a 0.006 inch (0.015 cm) wire-wound bar to provide a dry coat weight of about 0.60 g/m$^2$. The coating was dried for 35 seconds at 135° C.

The following tests were carried out on the coated inner layer (before the outer layer was coated):

Resistance to UV wash: Drops of diacetone alcohol (DAA)/water (4:1) were placed on the coated inner layer at 1-minute intervals up to 10 minutes, and then washed off with water. The time required to fully remove the coating was recorded. If the time required to remove the coating was greater than 10 minutes, the amount of coating removed in 10 minutes was approximated.

Resistance to UV wash: Drops of Daicure UV wash/water (9:1) were placed on coated inner layer at 1-minute intervals up to 10 minutes, and then washed off with water. The time required to fully remove the coating was recorded. If the time required to remove the coating was greater than 10 minutes, the amount of coating removed in 10 minutes was approximated.

Resistance to UV wash/alcohol-sub fount: Drops of butyl cellosolve (BC)/water (4:1) were placed on the coating inner layer at 1-minute intervals up to 10 minutes, and then washed off with water. The time required to fully remove the coating was recorded. If the time required to remove the coating was greater than 10 minutes, the amount of coating removed in 10 minutes was approximated.

Baking test: The coating inner layer was baked in a Mathis lab drier at 230° C. for 8 minutes with a fan speed of 1000 rpm. Positive image remover, PE3S (available from Kodak Polychrome Graphics, Japan Ltd) was applied at 2-minute intervals up to 12 minutes, and rinsed with water. The coating was considered to be 100% bakeable if the deletion gel was unable to remove any coating. The coating was considered to be 50% bakeable if the deletion gel was able to remove 50% of the coating.

Developer solubility: Drops of 956 Developer were applied to the coated inner layer at 2-second intervals up to 30 seconds, and washed off immediately with water. The time required to fully dissolve the coating was recorded.

The results of the tests are shown below in TABLES IV and V.

The following tests were used to evaluate the fully coated imageable element (outer layer coated over the inner layer):

Developer solubility: Drops of 956 Developer were applied to the coated outer layer at 30-second intervals up to 3 minutes, and then washed off with water. The time required for the developer to start attacking the outer layer was recorded Imaging tests: The elements were imaged using a commercially available Screen PTR4300 imagesetter. The C1 2400 Dpi internal test pattern was applied at a drum speed of 1000 rpm with exposures of 60, 65, 70, 75, 80, 85, 90, 95 and 100% power. The imaged elements were then processed in a Kodak Polychrome Graphics Sword Excel NE34 processor containing 956 Developer at a temperature of 23° C. for approximately 20 seconds. The resulting printing plates were evaluated for cleanout (minimum exposure necessary to produce a clean image) and best exposure (the exposure which produces best image quality).

The results of all of the tests are shown below in TABLE VI.

TABLE IV

| Formulation | Inner Layer Developer Test | Baking Test |
|---|---|---|
| 4 | 6 seconds | Not bakeable |
| 5 | 10 seconds | >90% bakeable |
| 6 | 4 seconds | 70% bakeable |

TABLE V

| Formulation | Chemical resistance tests - Time taken to remove the coating in UV wash solvents | | |
|---|---|---|---|
| | BC/water | DAA/water | UV Wash/water |
| 4 | >10 min (approx 40% coating removed) | >10 min (approx 90% coating removed) | >10 min (approx 10% coating removed) |
| 5 | >10 min (no coating removed) | >10 min (approx 5% coating removed) | >10 min (no coating removed) |
| 6 | >10 min (<5% coating removed) | >10 min (approx 15% coating removed) | >10 min (<5% coating removed) |

TABLE VI

| Example | Developer Drop test | Cleanout Energy | Best Exposure |
|---|---|---|---|
| 3 | 180 seconds | 90% | 100% - good image |
| 4 | 180 seconds | 95% | 100% - good image |
| 5 | 180 seconds | 90% | 100% - good image |

The invention has been described in detail with particular reference to certain preferred embodiments thereof, but it will be understood that variations and modifications can be effected within the spirit and scope of the invention.

The invention claimed is:

1. An imageable element comprising a substrate having thereon one or more layers, said element further comprising a radiation absorbing compound and a solvent-resistant polymer binder that is in the layer that is nearest said substrate, said solvent-resistant polymer binder comprising a polymer backbone and an —N(R)—C(=X)—N(R')—S(=O)$_2$— moiety that is attached to said polymer backbone, wherein X is O or S, and R and R' are independently hydrogen, halo, or an alkyl group having 1 to 6 carbon atoms.

2. The element of claim 1 wherein X is O and R and R' are independently hydrogen or a methyl or ethyl group.

3. The element of claim 1 wherein said solvent-resistant polymer binder is present in a dry coverage of from about 10 to 100 weight % based on total dry weight of the layer in which it is located, and is an acrylic resin comprising recurring units derived from one or more ethylenically unsaturated polymerizable monomers, at least one of which monomers comprises said —N(R)—C(=X)—N(R')—S(=O)$_2$— moiety.

4. The element of claim 3 wherein said solvent-resistant polymer binder is represented by the following Structure (I):

(I)

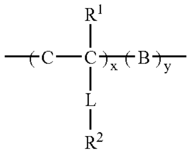

wherein $R^1$ is hydrogen, an alkyl group having 1 to 6 carbon atoms, or a halo group, $R^2$ represents —N(R)—C(=X)—N(R')—S(=O)$_2$—$R^3$, $R^3$ is an aliphatic group or an aryl group attached to —S(=O)$_2$— through a carbon atom, L is a direct bond or a linking group, B represents recurring units derived from one or more ethylenically unsaturated polymerizable monomers that do not contain an $R^2$ group, x is from about 20 to 85 weight %, and y is from 15 to about 80 weight %.

5. The element of claim 4 wherein R and R' are each hydrogen, $R^1$ is hydrogen, a methyl group, or chloro, $R^3$ is an alkyl group having 1 to 12 carbon atoms, cycloalkylene group having 5 to 10 carbon atoms in the ring, aryl group having 6 to 10 carbon atoms in the ring, or a heterocyclyl group, or any combinations thereof that are directly linked together, or linked together with an oxy, carbonyl, amido, or thio group, X is O, L is a —C(O)O-alkylene, —C(O)O-alkylene-phenylene-, or —C(O)O-phenylene group wherein alkylene has 1 to 4 carbon atoms, x is from about 25 to about 75 weight %, and y is from about 25 to about 75 weight %.

6. The element of claim 4 wherein B represents recurring units derived from a (meth)acrylate, (meth)acrylamide, vinyl ether, vinyl ester, vinyl ketone, olefin, unsaturated imide, unsaturated anhydride, N-vinyl pyrrolidone, N-vinyl carbazole, 4-vinyl pyridine, (meth)acrylonitrile, or styrenic monomer.

7. The element of claim 6 wherein B represents recurring units derived from one or more (meth)acrylates, styrenic monomers, (meth)acrylonitriles, N-substituted maleimides, or (meth)acrylamides.

8. The element of claim 4 wherein x is from about 30 to 70 weight % and the recurring units comprising said $R^2$ group are derived from one or more of the following ethylenically unsaturated polymerizable monomers A-1 through A-6:

(A-1)

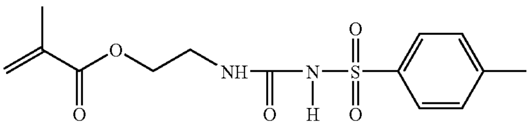

, (A-2)

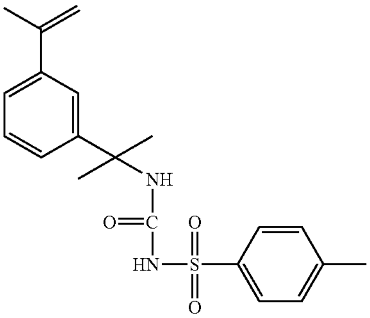

(A-3)

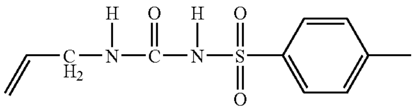

-continued (A-4)

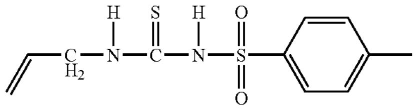

(A-5)

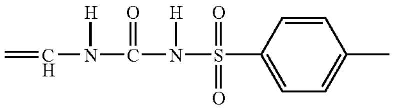

(A-6)

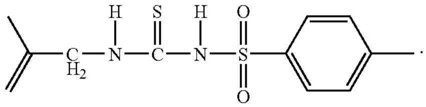

.

9. The element of claim 1 wherein said radiation absorbing compound is an infrared radiation absorbing dye that absorbs radiation at a wavelength of from about 700 to about 1200 nm.

10. The element of claim 1 comprising both inner layer and ink-receptive outer layer, said solvent-resistant polymer binder is present in said inner layer, and said ink receptive outer layer is free of polymers comprising said —N(R)—C(=X)—N(R')—S(=O)$_2$— moiety.

11. The element of claim 10 wherein said radiation-sensitive compound is present in said inner layer.

12. The element of claim 10 wherein said solvent-resistant polymer binder is represented by the following Structure (I):

(I)

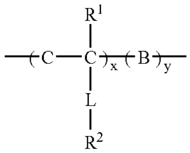

wherein $R^1$ is hydrogen, an alkyl group having 1 to 6 carbon atoms, or a halo group, $R^2$ represents —N(R)—C(=X)—N(R')—S(=O)$_2$—$R^3$, $R^3$ is an aliphatic group or an aryl group attached to —S(=O)$_2$— through a carbon atom, L is a direct bond or a linking group, B represents recurring units derived from one or more (meth)acrylates, styrenic monomers, (meth)acrylonitriles, N-substituted maleimides, or (meth)acrylamides that do not contain an $R^2$ group, x is from about 20 to 85 weight %, and y is from 15 to about 80 weight %.

13. The element of claim 12 wherein x is from about 30 to about 70 weight %, y is from about 30 to about 70 weight %, and B represents recurring units derived from about 1 to about 30 weight % of (meth)acrylamide, from about 25 to about 50 weight % of (meth)acrylonitrile, from about 1 to about 30 weight % of N-phenylmaleimide, and optionally from about 1 to about 30 weight % of methyl methacrylate or from about 1 to about 30 weight % of one or more of benzoic acid (meth)acrylamide, hydroxyphenyl (meth)acrylamide, and sulfamoylphenyl (meth)acrylamide.

14. The element of claim 1 that has a single imageable layer comprising said solvent-resistant polymer binder and said radiation absorbing compound.

15. The element of claim 14 wherein said solvent-resistant polymer binder is represented by the following Structure (I):

(I)

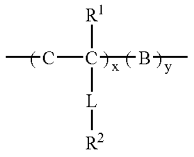

wherein $R^1$ is hydrogen, an alkyl group having 1 to 6 carbon atoms, or a halo group, $R^2$ represents —N(R)—C(═X)—N(R')—S(═O)$_2$—$R^3$, $R^3$ is an aliphatic group or an aryl group attached to —S(═O)$_2$— through a carbon atom, L is a direct bond or a linking group, B represents recurring units derived from one or more (meth)acrylates, styrenic monomers, (meth)acrylonitriles, N-substituted maleimides, or (meth)acrylamides that do not contain an $R^2$ group, x is from about 20 to 85 weight %, and y is from 15 to about 80 weight %.

16. The element of claim 15 wherein x is from about 30 to about 70 weight %, y is from about 30 to about 70 weight %, and B represents recurring units derived from about 1 to about 30 weight % of (meth)acrylamide, from about 25 to about 50 weight % of (meth)acrylonitrile, from about 1 to about 30 weight % of N-phenylmaleimide, and optionally from about 1 to about 30 weight % of methyl methacrylate or from about 1 to about 30 weight % of one or more of benzoic acid (meth)acrylamide, hydroxyphenyl (meth)acrylamide, and sulfamoylphenyl (meth)acrylamide.

17. A method for forming an image comprising:

A) thermally imaging the imageable element of claim 1, thereby forming an imaged element with imaged and non-imaged regions, B) contacting said imaged element with an alkaline developer to remove only said imaged regions, and C) optionally, baking said imaged and developed element.

18. The method of claim 17 wherein imaging is carried out using radiation having a maximum absorbance of from about 700 to about 1200 nm.

19. An imaged element obtained by the method of claim 17.

* * * * *